(12) United States Patent
Gao

(10) Patent No.: US 11,469,612 B2
(45) Date of Patent: Oct. 11, 2022

(54) MODULAR CONTROL AND DISPATCH FOR POWERING DATA CENTERS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/129,288

(22) Filed: Dec. 21, 2020

(65) Prior Publication Data

US 2022/0200331 A1 Jun. 23, 2022

(51) Int. Cl.
| | |
|---|---|
| B23K 11/24 | (2006.01) |
| H02B 1/24 | (2006.01) |
| H02J 9/06 | (2006.01) |
| H02S 40/38 | (2014.01) |
| G06F 1/26 | (2006.01) |

(52) U.S. Cl.
CPC .............. *H02J 9/068* (2020.01); *G06F 1/263* (2013.01); *H02J 9/061* (2013.01); *H02S 40/38* (2014.12)

(58) Field of Classification Search
CPC ........... H02J 9/068; H02J 9/061; G06F 1/263; H02S 40/38
USPC ........................................................ 307/112
See application file for complete search history.

(56) References Cited

U.S. PATENT DOCUMENTS

| | | | | |
|---|---|---|---|---|
| 10,998,746 B2* | 5/2021 | Kutkut | ................... | H02J 7/005 |
| 2014/0062206 A1* | 3/2014 | Bryson | ................... | H02J 3/385 |
| | | | | 307/80 |
| 2015/0333524 A1* | 11/2015 | Nishikawa | .............. | H02J 3/383 |
| | | | | 307/26 |
| 2017/0170683 A1* | 6/2017 | Navarro | ................... | H02M 7/44 |
| 2017/0194791 A1* | 7/2017 | Budde | ...................... | H02J 7/345 |
| 2018/0116070 A1* | 4/2018 | Broadbent | .............. | H02J 9/061 |

* cited by examiner

*Primary Examiner* — Richard Tan
(74) *Attorney, Agent, or Firm* — Womble Bond Dickinson (US) LLP

(57) ABSTRACT

A power delivery system for data center. Servers are divided into server clusters, and each server cluster is served by multiple power source with multiple inputs from a power supply module. Each power supply module includes a local bus and a local controller which controls connections on the local bus to deliver utility power to its assigned server cluster or backup power to any of the server clusters. Each of the power supply modules has a battery storage system with switchable connections to the local bus and to an inter-system bus, and a PV system with switchable connections to the local bus and to an inter-system bus. The battery storage system may be charged from the utility power or the PV system. The inter-system bus is connected to all of the server clusters, such that power flowing in the inter-system bus can be delivered and dispatched to power any server cluster.

17 Claims, 7 Drawing Sheets

MODULAR CONTROL AND DISPATCH FOR POWERING DATA CENTERS

FIELD OF THE DISCLOSURE

Embodiments of the present disclosure relate generally to architecture for power supply to data centers and, more particularly, the modular architecture enabling versatility in control of power distribution in clusters of data centers.

BACKGROUND

Generally, data centers incorporate redundant power supply to the servers and the various ancillary equipment (such as cooling, lights, etc.) so as to ensure uninterruptable service. The power supplies may include utility power (provided by utilities companies), diesel generators, and battery backup. In modern data centers the utility power may be delivered to the servers via Uninterruptible Power Supplies (UPS), which perform the required power conditioning and charge the backup battery bank. So, while the utility power supply is alternating current (AC), the utility power provides direct current (DC) power to the UPS energy storage units such as lead-acid batteries. The UPS also provides backup power through these lead-acid batteries for a short-duration utility power interruption; however, if a longer period interruption occurs, the diesel generators provide the backup power. The utility power is in either single phase or three phase AC when providing to the rack PSU (Power Supply Unit) or and server PSU. Then the PSU convert the AC to DC then delivered to the boards. In some recent solutions, the PSU may directly intake DC input.

The power supply redundancy required in order to ensure uninterruptable operation increases the cost and complexity of the data center. Moreover, much of the equipment that is dedicated for redundancy idles most of the time, thereby leading to inefficient use of resources. This is exacerbated by the fact that the backup equipment requires periodic maintenance even if it is not used.

Data centers generally are composed of hundreds or thousands of servers and related operational equipment. These servers are interconnected to provide computing and storage facilities to subscribers. Each of these servers houses a prescribed amount of CPU, GPU, ASIC, DIMM, SSD or HHD, etc. When capacity increase is needed, additional server units can be added, each with its own prescribed amount of CPU, GPU, ASIC, DIMM, SSD or HHD. The addition of servers also requires the addition of facility equipment, such as power supply and redundant backup equipment. However, such an approach to capacity expansion is inefficient.

In addition, the continues updated environmental regulations such as $CO_2$ emission limitations in different areas may limit the use and install of diesel generation systems. New form of energy may be useful and provide possible new solutions for powering data center with proper installation and use case design.

SUMMARY

Disclosed embodiments provide architectures for supplying power to data center in efficient manner using modules, wherein each module is coupled to an assigned server cluster. Upon expansion, additional modules can be easily added. In normal operation each server cluster is fed by utility power from its own assigned module. Conversely, backup power can be shared among the modules using an inter-system DC bus, such that the backup systems are efficiently utilized.

Disclosed embodiments provide a module for supplying electrical power to a server cluster, comprising: a direct current (DC) bus; a utility switch connecting a utility power supply to the DC bus; a power line connecting the DC bus to the server cluster; a battery storage and a storage switch connecting the battery storage to the DC bus; a photovoltaic (PV) system and a PV switch connecting the PV system to the DC bus; and, a local controller controlling power delivery to the server cluster.

Disclosed aspects further provide power supply system for data center having a plurality of server clusters, each server cluster having a plurality of servers, comprising: an inter-system bus having a plurality of backup switchable connections, each backup switchable connection connecting the inter-system bus to one of the plurality of server clusters; a main controller coupled to the inter-system bus and activating the plurality of backup switchable connections; a plurality of power supply modules, each power supply module supplying utility power to an assigned one of the server clusters and supplying backup power to all of the server clusters, each of the power supply modules comprising: a switchable utility power connection to the assigned one of the servers; a module bus coupled to the switchable utility power connection; a battery storage system coupled to the inter-system bus; a renewable energy system coupled to the inter-system bus; a local controller coupled to the module bus and activating the switchable utility power connection.

Further disclosed aspects also provide data center, comprising: an inter-system bus; a plurality of server clusters, each of the server clusters having a switchable utility power connection to a utility power supply and a switchable backup power connection to the inter-system bus; a plurality of battery storage systems, each having a switchable connection to the inter-system bus; a plurality of solar panel systems, each having a switchable connection to the inter-system bus; and a main controller activating the switchable connections of the battery storage systems and the switchable connections of the solar panel systems to provide backup power.

BRIEF DESCRIPTION OF THE DRAWINGS

Embodiments of the invention are illustrated by way of example and not limitation in the figures of the accompanying drawings in which like references indicate similar elements.

FIG. 1A is a block diagram illustrating an example of system architecture according to an embodiment, while

DETAILED DESCRIPTION

Figure 1A:
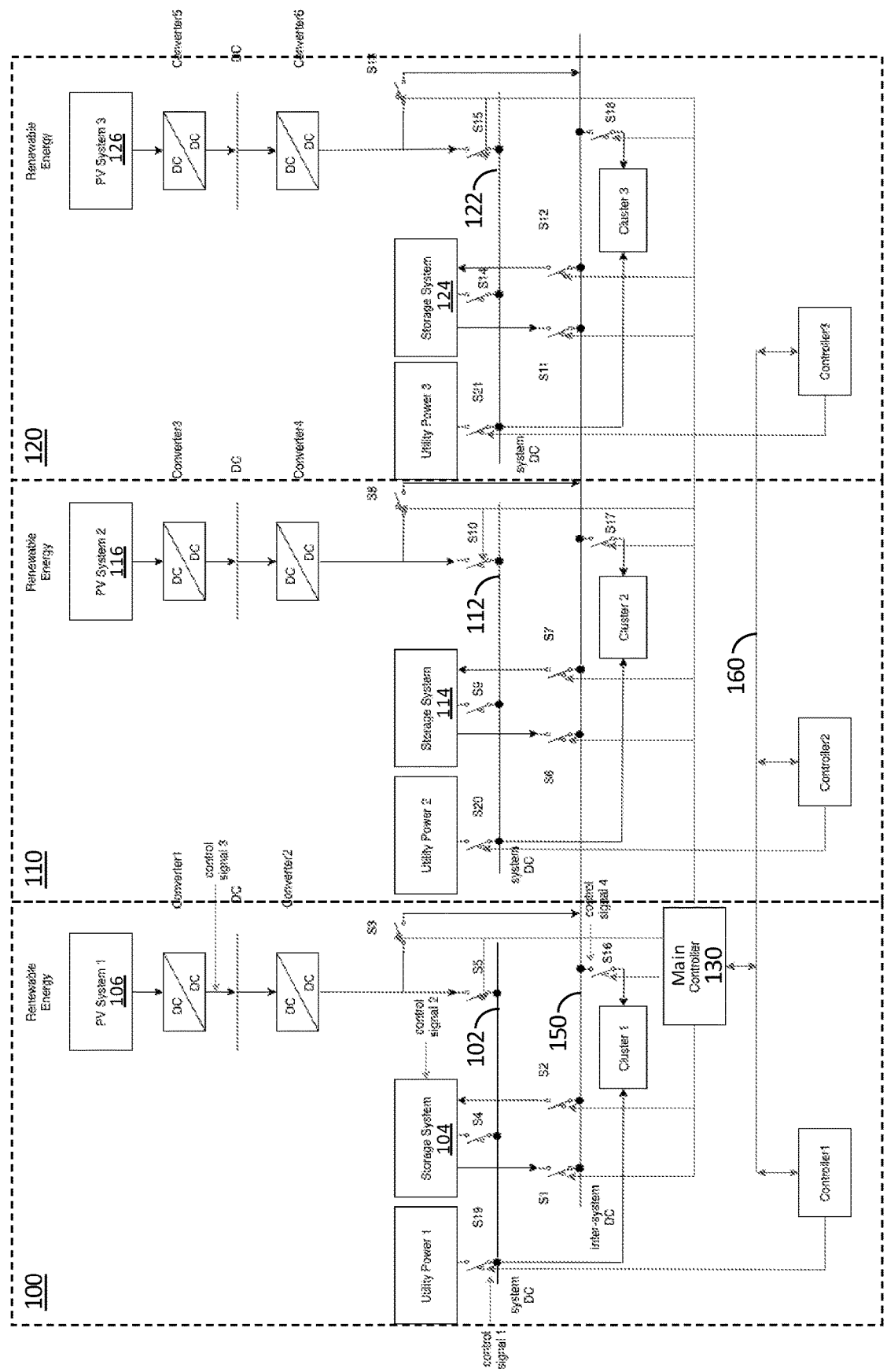

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The following detailed description provides examples that highlight certain features and aspects of the innovative power supply and backup arrangements claimed herein. Different embodiments or their combinations may be used for different applications or to achieve different results or benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

The current disclosure introduces a modular design and architecture that enables flexible configuration of redundant power supply for servers in data centers. Disclosed embodiments provide "green" or sustainable solutions that reduce capital and operational costs, and maximized utilization and efficiency of the power distribution network.

Disclosed embodiments include design of power system distributed among different subsystems in data center. The design consists of two levels: system level and the control level. The embodiments aim at improving the efficiency of power usage during different operating conditions by controlling the power flow between subsystems dynamically.

Disclosed embodiments incorporate multiple power sources in the distribution system, including utility power, storage system (batteries) and renewable power (PV panels). The utility power is a stable power resource and is used to directly power the servers, i.e., not via UPS. The storage system consists of batteries which can store power from utility or renewable resources. The storage system can be used to serve the cluster of the same subsystem when the utility power is not available or there is not enough power from other resources. The renewal energy is dispatched to serve different loads in different scenarios, and it is controlled based on its availabilies. Each of the power systems can be modularized and pre-packaged before delivered to the data center.

FIG. 1A is a general schematic illustrating an embodiment for power distribution in data center. The embodiment illustrated in FIG. 1A consists of three identical modules, 100, 110 and 120, and the entire system may include as many modules as needed to serve all of the servers. Moreover, the system can be easily expanded when needed by the simple addition of modules. The following is a description of the structure and operation of each module, and the interoperation among modules.

Each of the modules may be referred to as a sub-system, and each of the modules include three energy sources: utility power, storage power, and regenerative power (PV modules). The power of each module is controlled and delivered via system DC bus 102, 112, 122. As illustrated, the power is delivered via power connection from each system DC bus to a respective server cluster, indicated in FIG. 1A as cluster 1, cluster 2 and cluster 3. For example, by closing switches S19, S20 and S21, each of the clusters is fed directly from the utility power, which is the normal mode of operation. Similarly, by closing switches S4, S9 and S14, each of the clusters may be fed from the battery storage. Finally, by closing switches S5, S10, and S15, each of the clusters may be fed from the renewable source. Each of these switches may be controlled independently by its respective local controller, indicated as controller 1, controller 2, and controller 3, such that each cluster may be fed from a different source as needed. Each of the local controllers communicate with the main controller 130 via communication bus 160, which also controls interoperation as will be described below.

The independent modules are also interconnected via inter-system DC bus 150. That is, within each module, the server cluster may be connected to the inter-system DC bus 150 via switches S16, S17 and S18. The inter-system DC bus 150 may be fed by any or all of the storage systems 104, 114 and/or 124 and by any or all of the renewable energy systems 106, 116 and/or 126. The various switches of the inter-system DC bus 150 are controlled by the main controller 130, such that any of the clusters may be energized by any of the available sources of any cluster. That is, using the inter-system DC bus 150, a server cluster of one module may be energized by a power source of another module. In this manner, the backup resources are shared among the modules to reduce the amount of required backup power sources needed to be physically configured per server cluster, while increasing the available backup resources during certain operations.

The embodiment illustrated in FIG. 1A includes an optional feature wherein each of the renewable systems includes the photovoltaic system connected to a first and a second DC-DC converters. The first DC converter, i.e., each of converter 1, converter 3, and converter 5, is used to control the voltage supplied by each individual PV system and to control the interconnection of all of the individual PV panels. The second converter, i.e., each of converter 2, converter 4 and converter 6, is used to control the voltage applied from each of the individual PV systems to the inter-system DC bus 150. Multiple level convertors may improve the configuration flexibilies for further system upgrading and adjusting.

The implementation of two level DC bus provides versatility in powering the modules. The following are examples of powering the system. In normal mode of operation, switches S19, S20 and S21 are closed by the respective local controllers. In this position, each of the server clusters is fed directly by the utility power. When needed, each of switches S4, S9 or S14 may be closed, such that the respective storage system, 104, 114, or 124 may be charged from the utility power. Conversely, if any of switches S19, S20 or S21 is open and the corresponding storage switch S4, S9 or S14 is closed, the respective server cluster can be fed by the respective storage system. Also, each of the storage systems may be charged by the corresponding renewable source as follows. Taking the first module as an example, closing switches S4 and S5 would deliver the energy from the PV system 106 to charge the batteries of storage system 104.

The versatility is further enhanced by using interconnection of the inter-system DC bus 150. To illustrate, when switches S19, S4 and S5 are open, power can be supplied to server cluster 1 by closing switch S16 to the inter-system DC bus 150. Then energy can be supplied to the inter-system DC bus 150 from any of the storage or PV systems of any module. For example, backup power may be supplied by closing any or all of switches S1, S6 and/or S11, such that the power to the inter-system DC bus 150 is provided by any or all of the storage systems 104, 114 and/or 124. Power to the inter-system DC bus may also be supplied from any or all of the PV systems by closing switches S3, S8 and/or S13. Note that when any of switches S2, S7 and/or S12 are closed, the respective storage system can be charged by the PV systems. It needs to be motioned that different lines connected to the storage systems can be understood as representing the power flow. The lines on which the S1 and S2 switches are installed can be understood as forming a complete full circuit. This means that the switches S1 and S2 can be combined as one unit on a single line. The line on which S4 is installed can be understood as a second input line for charging from system DC bus 102.

Figure 1B:
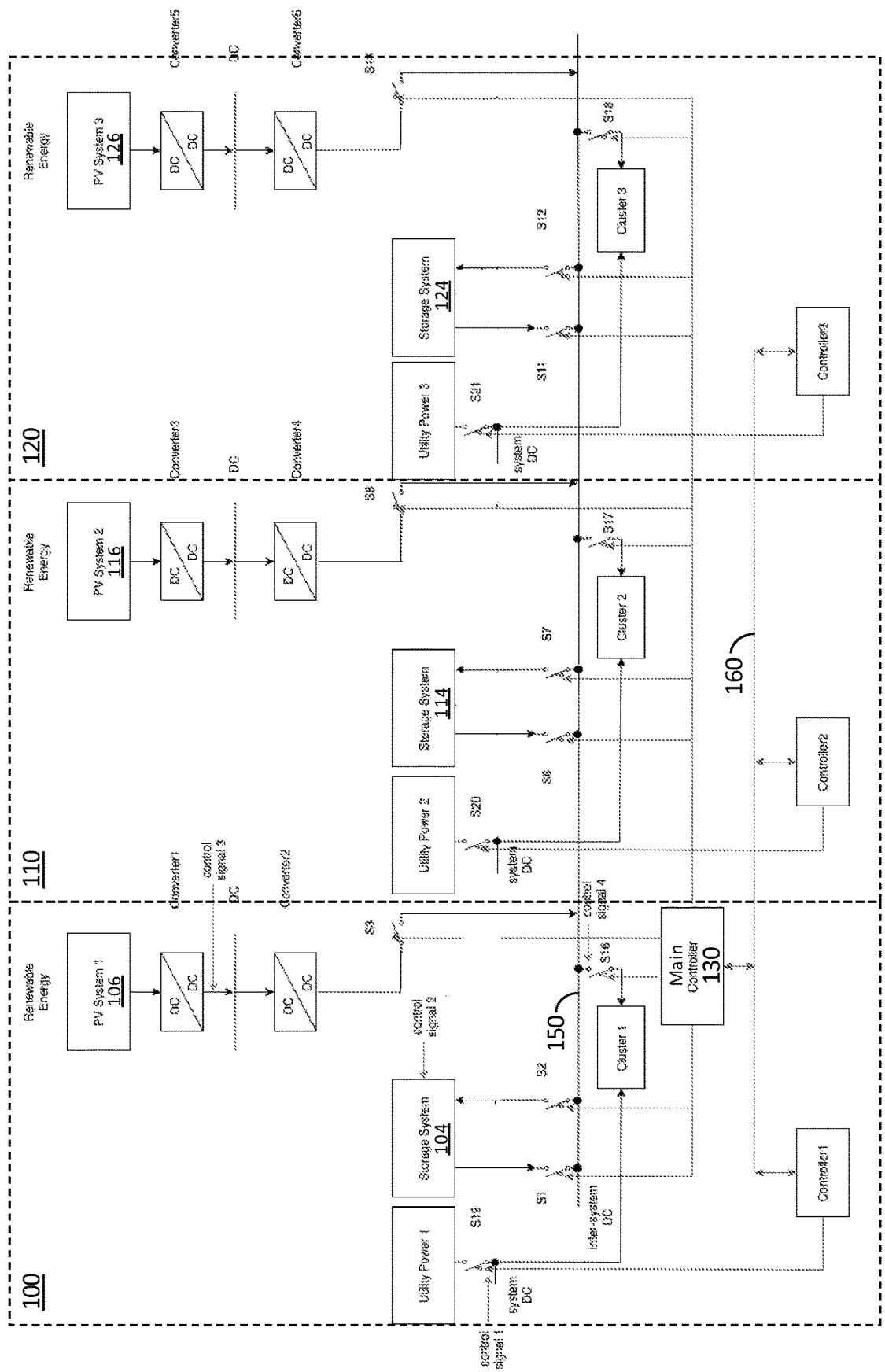
FIG. 1B illustrates an architecture according to another embodiment.

FIG. 1B illustrates another embodiment of the system. The embodiment of FIG. 1B is similar to that of FIG. 1A, except that the storage power and PV system power can only be delivered via the inter-system bus 150, while the utility power is only delivered to each sever cluster via a dedicated switchable power connection. Other than that, the systems are the same and the various elements are identified by the same reference numerals.

Figure 2:
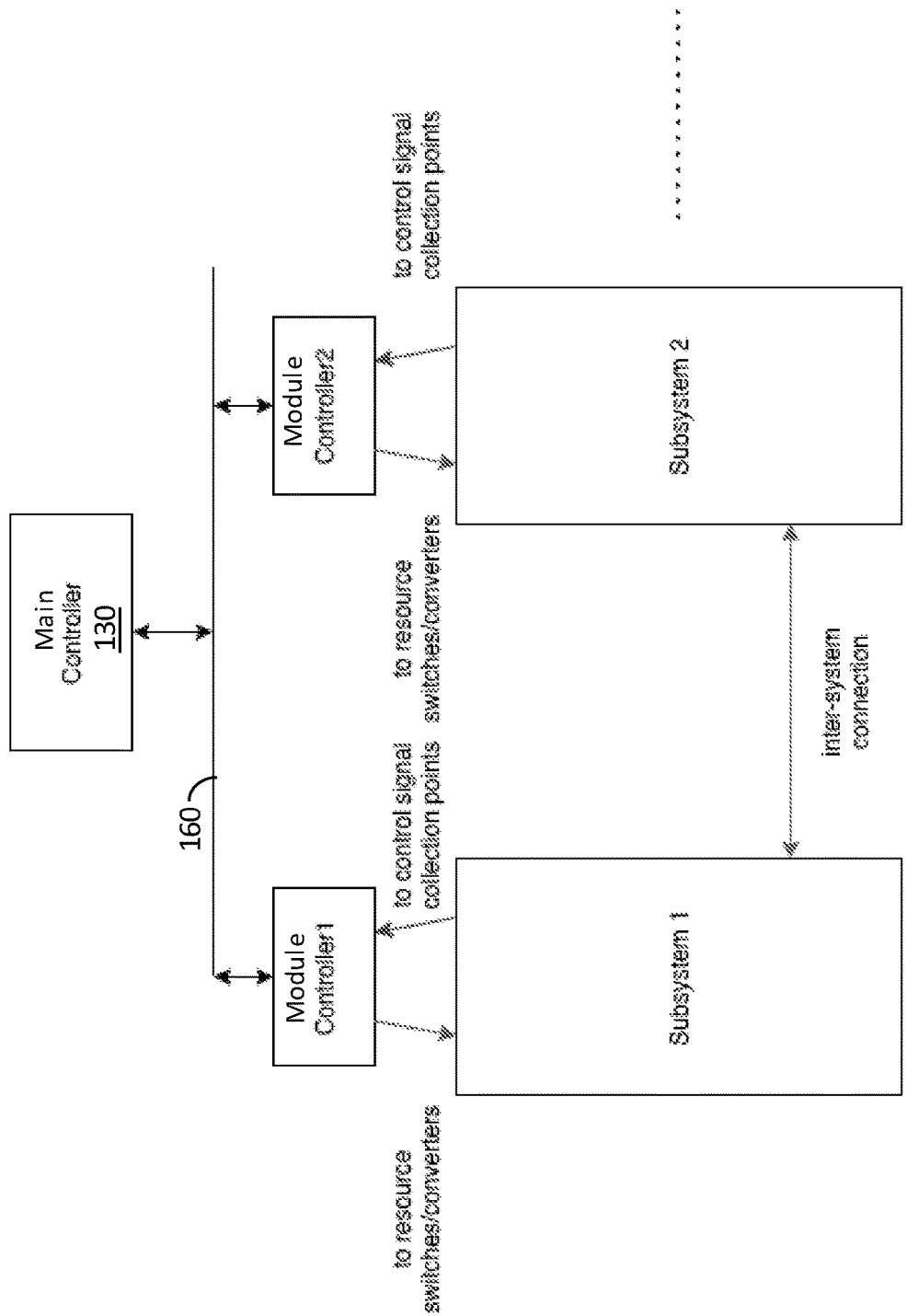
FIG. 2 illustrates a block diagram of a two-layer control arrangement according to an embodiment.

As noted, a two-layer control system is implemented to operate the various switches of the sub-systems. FIG. 2 illustrates a block diagram of a two-layer control arrangement according to an embodiment. Main controller 130 communicates via communication bus 160 with the module controllers. This is a high-level communication, e.g., the main controller 130 may instruct module controller 1 to connect its server cluster to utility power and instruct module controller 2 to disconnect its server cluster from the utility power and connect to backup power. The module controllers receive the high-level instructions and translate these to specific operation of the various switches within the module controller's subsystem. So, in the example just provided, module controller 1 would place switch S19 in the closed position and all other switches in its module in open position, while module controller 2 would place switch S20 in the open position and switches S17 and S6 in the closed position. Depending on further instructions of the main controller 130, other subsystem controllers may control other switches to connect other storage systems and/or PV systems to the inter-system DC bus to supply backup power to cluster 2.

The subsystem controllers also collect information regarding the status of all of the power resources (utility power, storage system and PV system) through sensors. The subsystem controllers exchange the information with the main controller 130. Using the data received from the subsystem controllers, operational decision are made by the main controller 130 using an optimization algorithm. The main controller can then either send control signals itself to the various switches, or provide high-level instructions to the subsystem controllers to update the state of the switches and/or converters.

Figure 3:
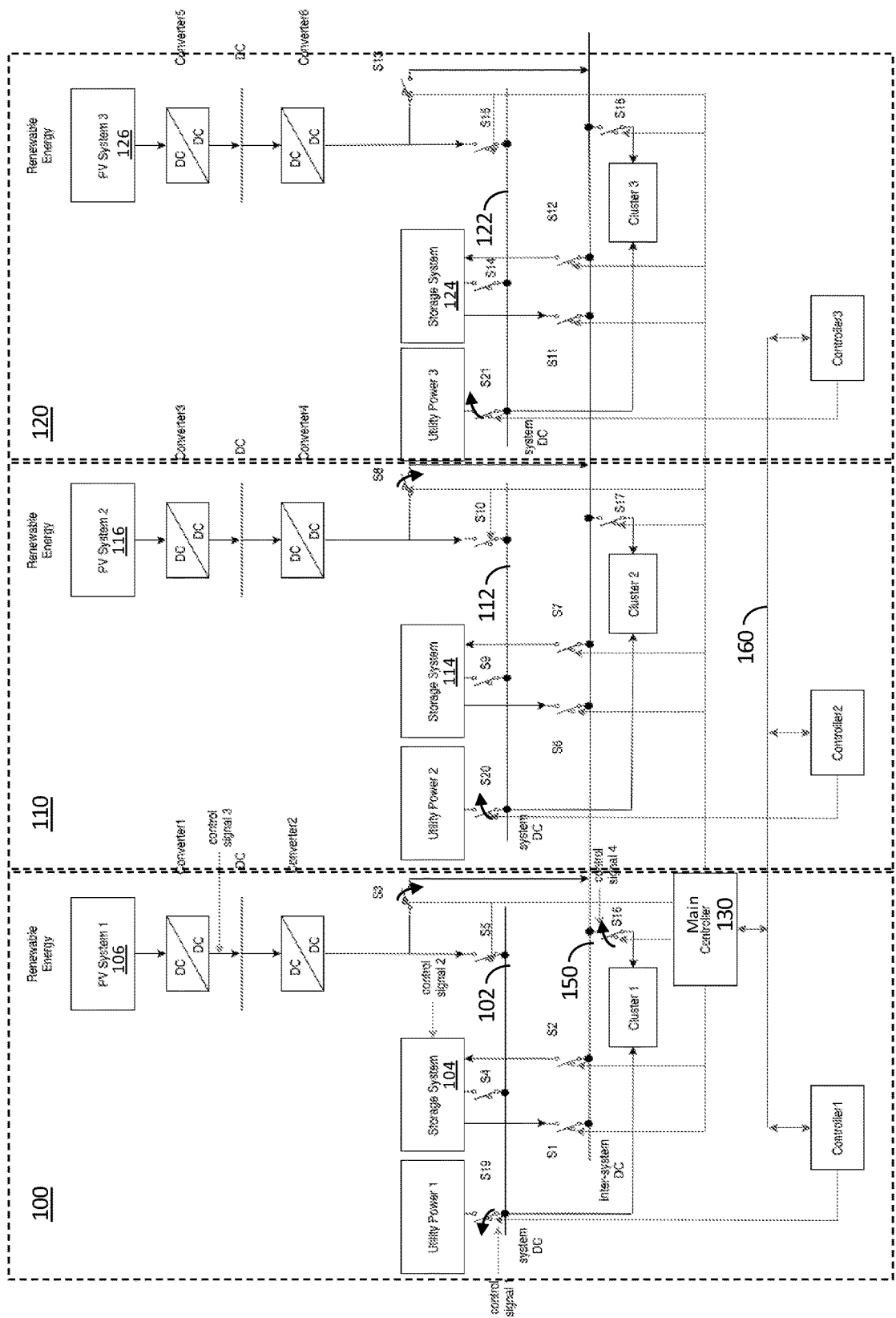
FIG. 3 illustrates an example of set-up of a system for maintenance, according to disclosed embodiments.

The following provides some examples of operation of the system of FIG. 1A. FIG. 3 illustrates a situation wherein the utility power 1 of subsystem 100 undergoes maintenance. As illustrated by the curved arrow, switch S19 is opened to disconnect the utility power 1 from the server cluster 1. Conversely, switch S16 is closed so as to connect the server cluster 1 to the inter-system DC bus 150. The main controller 130 receives the signals from each subsystem to determine whether there is enough power from the corresponding PV system or storage system to supply the server cluster 1. If PV system 1 of subsystem 100 has power, switch S3 will be closed; if PV system 2 of subsystem 110 has power, S8 will be closed; and, just as an example, PV system 3 of subsystem 120 has insufficient power and therefore switch S13 remain open. If there are additional subsystems, identical process is conducted for the other subsystems and the switches are closed if the sources have power, correspondingly.

Then, the controller calculates whether there is sufficient total power to serve the cluster 1, which is under maintenance. If not, the controller will close the appropriate switches so as to connect selected storage systems to supply the rest of the power that is needed. In this example, PV systems 1 and 2 have sufficient power at present, so only switches S3 and S8 are closed to obtain power from those solar panels. Once maintenance is completed, switches S16, S3 and S8 are opened and switch S19 is closed to return to normal operation with utility power.

Figure 4:
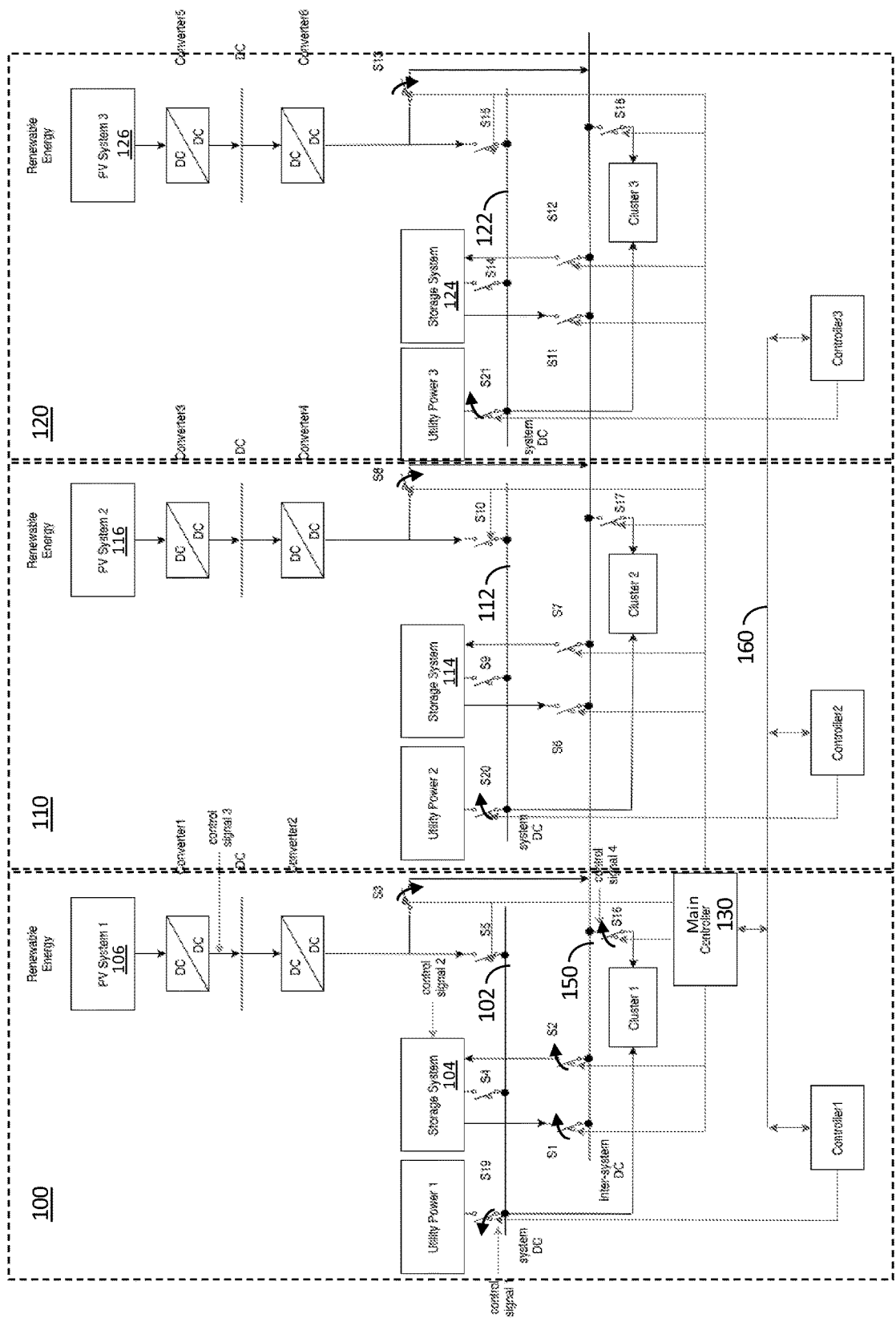
FIG. 4 illustrates an example of a set-up wherein utility power 1 fails, according to disclosed embodiments.

To provide another example, FIG. 4 illustrates the situation wherein utility power 1 fails. In order to ensure uninterruptable service, switch S16 is closed to feed power from the inter-system DC bus 150, and switch S1 is closed to provide immediate backup power from the storage system 104. The main controller 130 will then receive signals from each subsystem to determine whether there is enough power from the PV systems and/or storage systems. For example, if PV system 106 of subsystem 1 has power, switch S3 will be closed; if PV system 116 of subsystem 2 has power, switch S8 will be closed, etc.

Also, switch S2 may be closed so that the energy from the PV systems may be used to charge the storage system 104. A battery based energy storage system may not be able to perform charging and discharging at the same time. However, as explained in the previous sections, switches S1 and S2 may be a single circuit on one close loop connecting between the storage system 104 and Inter-system DC bus 150. Therefore, the storage system 104 is controlled in the discharging or charging mode only.

Furthermore, if the failure is prolonged, other storage systems may be connected to the inter-system DC bus to provide additional backup power. For example, switch S6 may be closed to apply the power from the storage system 114 and switch S11 may be closed to apply the power from storage system 124. The position illustrated in FIG. 4 has storage system 104 powering the server cluster 1, and PV systems 106, 116 and 126 directly powering the cluster via switch S16. Clusters 2 and 3, on the other hand, receive their power from the utility.

Figure 5:
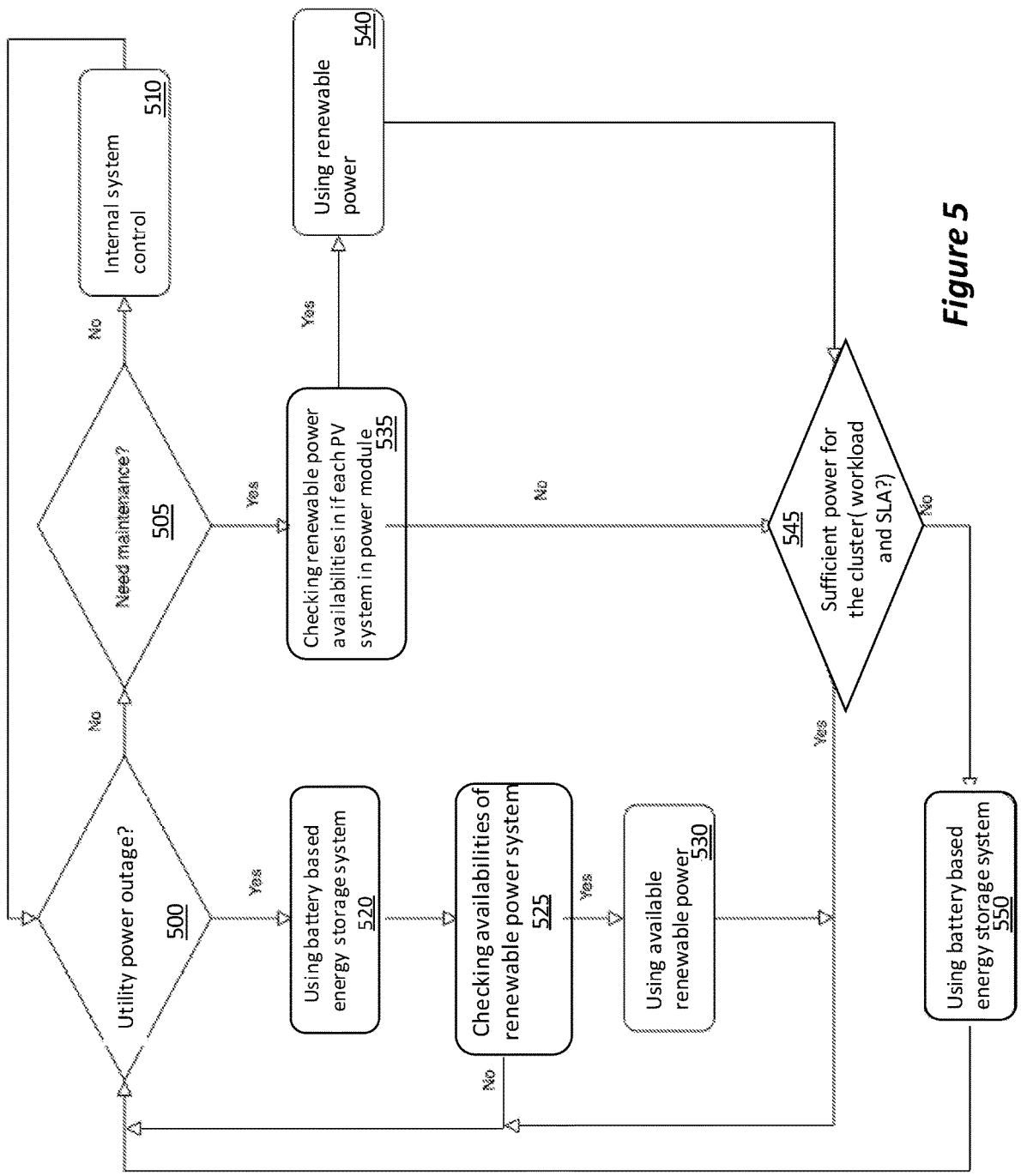
FIG. 5 illustrates an example of a control logic design according to an embodiment.

FIG. 5 illustrates an example for a control logic of the system. The main controller 130 periodically checks the state of the system, and the steps and order illustrated and described herein is chosen arbitrarily as one example only. At 500 the main controller 130 checks whether any of the subsystems encounters a power outage from the utility power supply. If no outage is detected, at 505 the main controller 130 checks whether any of the elements requires maintenance. If no maintenance request is detected, at 510 control remains with the local controllers and the main controller 130 returns to the start of the cycle.

The difference between the maintenance case and the power outage case is that the maintenance mode can be pre-planned and controlled, so that the outage period of the utility power source is controlled. This means that the backup power source from the inter-system DC bus can more safely shared. For example, the maintenance can be executed in phases, so that the decrease in utility power can be better covered by the back-up sources available on the intersystem DC bus. Conversely, for the power outage mode, the loss of power is significant and unpredictable, so that all the backup power sources may need to be fully dedicated for its clusters depending on the power outage scenarios.

Conversely, if at 500 it is noted that one of the subsystem experiences utility power outage, main controller 130 will send the signal at 520 to close the switch between the storage system and the inter-system DC bus to immediately to make sure the cluster is served by battery backup power. Then, at 525, the main controller 130 will check each subsystem to see whether it has sufficient renewable power and, if so, at 530 close the switch between the renewable resource and the inter-system DC bus 150.

In 505, if a subsystem requires maintenance, the main controller 130 will check whether any of the subsystems has available renewable power, and at 540 the main controller would use the available renewable power from any subsystem that has it. Then, at 545, the main controller 130 checks whether the available renewable energy is sufficient to power the cluster during the maintenance period. If so, it maintains the connection to the PV system(s). However, if not enough solar energy is available, at 550 the main controller 130 would revert to the storage system of the subsystem to be maintained so as to provide extra power. If required, additional backup power may be obtained from the storage systems of the other subsystems connected to the inter-system DC bus 150.

Figure 6:
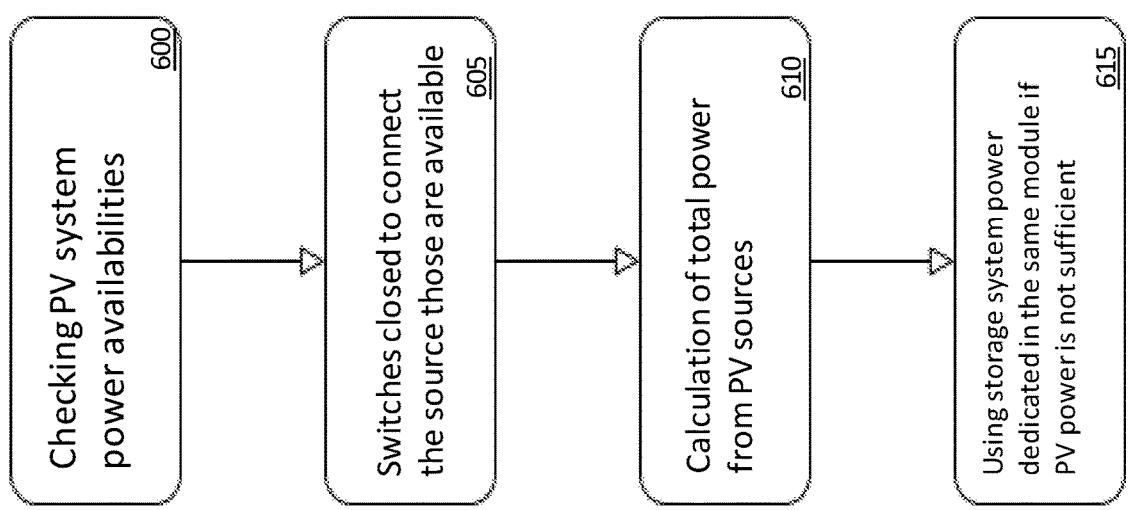
FIG. 6 illustrates an example of a control flow according to an embodiment.

As noted previously, the main controller 130 may issue high-level commands to the local controller and the local controller execute these commands by generating the local control signals. An example of such process is illustrated by the flow chart of FIG. 6, wherein the local controller executes local commands to effect power supply during maintenance of a subsystem. At 600, the controller checks each of the PV systems to see whether they can provide sufficient power. At 605, the controller closes the switch of each of the PV systems that provides sufficient power to connect it to the inter-system DC bus 150. At 610 the controller calculates the total power available from the PV systems connected to the inter-system DC bus. At 615, if the total power is insufficient, the controller closes the switch of the storage system to the inter-system DC bus 150. In the controller, the response time and latency should be different for power outage mode and maintenance mode.

Figure 7:
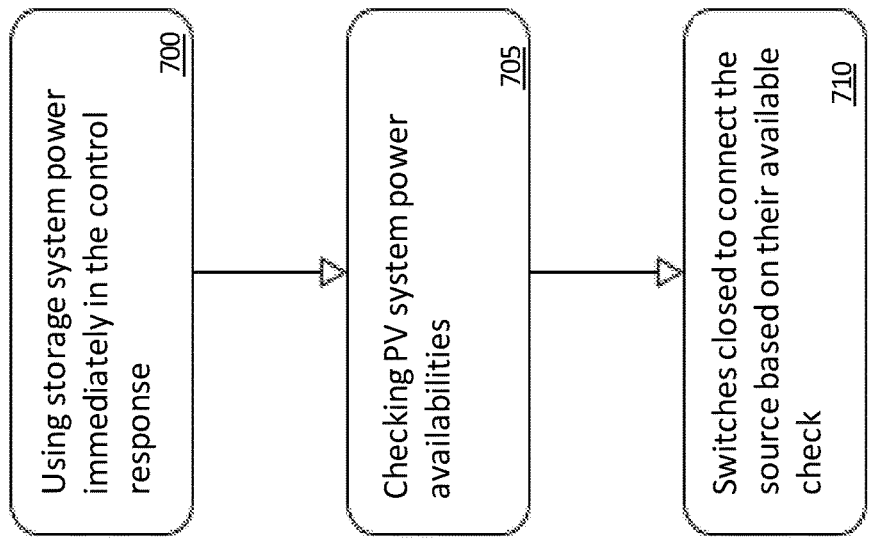
FIG. 7 illustrates an example of a control flow according to another embodiment.

Another example is illustrated by the flow chart of FIG. 7, wherein a local controller executes local commands in the case of utility power outage. At 700, upon sensing loss of utility power, the storage system of the affected server cluster is immediately connected to supply backup power. At 705 the controller checks all of the PV system to determine whether they can supply power to the affected cluster. At 710 the local controller closes the switches of any PV system that has available power, to thereby connect it to the inter-system DC bus 150. Before 705, all the corresponding energy storage systems are connected to the inter-system DC bus.

Once the backup power sources including the energy storage system and PV system are connected to the inter-system DC bus, then the power distribution and dispatch algorithm in the power outage mode may also correlate to the workload and SLA (Service Level Agreement) in each clusters.

With the above disclosure, a power supply system for a plurality of server clusters is provided, the system comprising a plurality of subsystems wherein each subsystem is associated with one of the plurality of clusters, each of the subsystem comprising a system DC bus, a utility switch connecting utility power to the system DC bus and to the associated cluster, a storage system having a storage switch connecting the storage system to the system DC bus, a renewable energy system having renewable switch connecting the renewable energy system to the system DC bus, and a local controller connected to the system DC bus, the system further comprising an inter-system DC bus having a plurality of backup power switches, each connecting the inter-system DC bus to one of the plurality of clusters, a plurality of backup storage switches, each connecting the inter-system DC bus to one of the storage systems, and a plurality of PV switches, each connecting the inter-system DC bus to one of the renewable energy switches.

In the disclosed embodiments, each of the server cluster may be provided energy from the sources available on its own DC bus via a power line that is connected between the DC bus and the server cluster. The server cluster may also receive power from any battery storage system and any PV system (including the ones connected to its own DC bus) via a second power line connected between the inter-system DC bus and the cluster. The second power line includes a switch to connect and disconnect the server cluster from the inter-system DC bus.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A module for supplying electrical power to a server cluster, comprising:
   a direct current (DC) bus;
   a utility switch connecting a utility power supply to the DC bus;
   a power line connecting the DC bus to the server cluster;
   a battery storage and a storage switch connecting the battery storage to the DC bus;
   a photovoltaic (PV) system and a PV switch connecting the PV system to the DC bus;
   a local controller connected to the DC bus;
   an inter-system DC bus having connection to external modules;
   a first switchable connection between the battery storage and the inter-system DC bus;
   a second switchable connection between the PV system and the inter-system DC bus; and
   a switchable power line connected between the inter-system DC bus and the server cluster.

2. The module of claim 1, further comprising a switchable line connected between the battery storage and the inter-system DC bus for charging and discharging.

3. The module of claim 1, further comprising a main controller connected to the inter-system DC bus and to the local controller.

4. The module of claim 3, wherein the local controller is configured to control utility power flowing in the DC bus and the main controller is configured to control power flowing in the inter-system DC bus.

5. The module of claim 1, wherein the PV system comprises a plurality of PV panels, a first converter conditioning power output from the PV panels, and a second converter receiving output power of the first converter and conditioning the output power for the DC bus and the inter-system DC bus.

6. A power supply system for data center having a plurality of server clusters, each server cluster having a plurality of servers, comprising:
    an inter-system bus having a plurality of backup switchable connections, each backup switchable connection connecting the inter-system bus to respective one of the plurality of server clusters;
    a main controller coupled to the inter-system bus and activating the plurality of backup switchable connections;
    a plurality of power supply modules, each power supply module supplying utility power to an assigned one of the server clusters and supplying backup power to all of the server clusters, each of the power supply modules comprising:
        a switchable utility power connection to the assigned one of the servers;
        a module bus coupled to the switchable utility power connection;
        a battery storage system coupled to the inter-system bus;
        a renewable energy system coupled to the inter-system bus;
        a local controller coupled to the module bus and activating the switchable utility power connection.

7. The system of claim 6, wherein the battery storage system is further coupled to the module bus.

8. The system of claim 7, wherein the renewable energy system is further coupled to the module bus.

9. The system of claim 8, further comprising a control connection between the main controller and the local controllers.

10. The system of claim 6, wherein the renewable energy system comprises a plurality of solar panels connected to a first converter and a second converter receiving output power of the first converter and providing conditioned power to the inter-system bus.

11. The system of claim 6, wherein each of the battery storage systems comprises a switchable power delivery connection to the inter-system bus and a switchable charging connection from the inter-system bus.

12. The system of claim 6, wherein each of the local controllers is configured to control power flowing in the respective module bus and the main controller is configured to control power flowing in the inter-system bus.

13. A data center, comprising:
    an inter-system bus;
    a plurality of server clusters, each of the server clusters having a switchable utility power connection to a utility power supply and a switchable backup power connection to the inter-system bus;
    a plurality of battery storage systems, each having a switchable connection to the inter-system bus;
    a plurality of solar panel systems, each having a switchable connection to the inter-system bus;
    a main controller activating the switchable connections of the battery storage systems and the switchable connections of the solar panel systems to provide backup power;
    a plurality of local busses, each coupled to a respective one of the server clusters;
    a plurality of backup switches, each connecting respective one of the battery storage systems to respective one of the local busses; and
    a plurality of PV switches, each connecting respective one of the solar panel systems to respective one of the local busses;
    wherein each of the switchable utility power connections is connected to respective one of the local busses.

14. The data center of claim 13, further comprising a plurality of local controllers, each activating one of the switchable utility power connections.

15. The data center of claim 14, further comprising a communication link coupling the main controller and the plurality of local controllers.

16. The data center of claim 13, wherein each of the plurality of solar panel systems comprises: a plurality of solar panels connected to a first converter, and a second converter receiving output of the first converter and providing a regulated power.

17. The data center of claim 14, wherein each of the local controllers is configured to control power flowing in the respective one of the local busses and the main controller is configured to control power flowing in the inter-system bus.

* * * * *